United States Patent [19]

Chen et al.

[11] Patent Number: 5,704,986

[45] Date of Patent: Jan. 6, 1998

[54] SEMICONDUCTOR SUBSTRATE DRY CLEANING METHOD

[75] Inventors: Chien-Fong Chen; Chia-Chun Cheng; Chi-Fu Chang, all of Hsin-Chu; Kuo-Sheng Chuang, Tai-Nan, all of Taiwan

[73] Assignee: Taiwan Semiconductor Manufacturing Company Ltd., Hsin-Chu, Taiwan

[21] Appl. No.: 529,635

[22] Filed: Sep. 18, 1995

[51] Int. Cl.[6] .................................................. B08B 5/00
[52] U.S. Cl. ............................... 134/2; 134/26; 134/30
[58] Field of Search ............................... 134/2, 1.2, 1.3, 134/30, 26, 22.1, 3, 22.11, 22.12, 22.18; 437/191, 228, 239; 156/626, 643.1

[56] References Cited

U.S. PATENT DOCUMENTS

| | | | |
|---|---|---|---|
| 3,837,905 | 9/1974 | Hile et al. | 117/201 |
| 4,341,592 | 7/1982 | Shortes et al. | 156/643.1 |
| 4,563,367 | 1/1986 | Sherman | 427/39 |
| 4,849,375 | 7/1989 | Gluck et al. | 437/225 |
| 4,923,828 | 5/1990 | Gluck et al. | 156/643.1 |
| 5,043,224 | 8/1991 | Jaccodine et al. | 428/446 |
| 5,178,721 | 1/1993 | Sugino | 156/626 |
| 5,244,843 | 9/1993 | Chau et al. | 437/239 |
| 5,298,075 | 3/1994 | Lagendijk et al. | 134/2 |
| 5,328,867 | 7/1994 | Chien et al. | 437/191 |
| 5,407,867 | 4/1995 | Iwasaki et al. | 437/228 |

*Primary Examiner*—Jill Warden
*Assistant Examiner*—Alexander Markoff
*Attorney, Agent, or Firm*—George O. Saile; Stephen B. Ackerman; Alek P. Szecsy

[57] ABSTRACT

A method for cleaning a semiconductor substrate. Introduced into a semiconductor substrate processing chamber is a semiconductor substrate. The semiconductor substrate and the semiconductor substrate processing chamber are maintained at a temperature not exceeding about 800 degrees centigrade. Introduced substantially simultaneously with the semiconductor substrate into the semiconductor substrate processing chamber is a low flow of a first oxidant gas. Introduced into the semiconductor substrate processing chamber immediately subsequent to the low flow of the first oxidant gas is a high flow of a second oxidant gas. Introduced into the semiconductor wafer processing chamber no earlier than the high flow of the second oxidant gas is a flow of a chlorine containing getter material. The semiconductor substrate is exposed to the high flow of the second oxidant gas and the flow of the chlorine containing getter material at a temperature not exceeding 800 degrees centigrade for a time period sufficient to remove organic contaminant residues and metal ion contaminant residues from the surface of the semiconductor substrate.

24 Claims, 5 Drawing Sheets

800°C push in  annealing  pull out  800°C
     15 min    20 min     15 min

N2   20 slpm  10 slpm    20 slpm

*FIG. 5 - Prior Art*

800°C push in  clean  annealing  pull out  800°C
     15 min   10 min  20 min     15 min N2   20 slpm         10 slpm    20 slpm high O2              8 slpm low O2   380 sccm TDCE            175 sccm

SEMICONDUCTOR SUBSTRATE DRY CLEANING METHOD

BACKGROUND OF THE INVENTION

1. Field of the Invention

The present invention relates generally to methods for cleaning semiconductor substrates. More particularly, the present invention relates to a low temperature in-situ dry cleaning method for simultaneously removing from semiconductor substrate surfaces both organic contaminant residues and metal ion contaminant residues.

2. Description of Related Art

One of the inevitable consequences of the methods through which integrated circuits are fabricated is the formation of contaminant residues upon the surfaces of semiconductor substrates. Of the several categories into which contaminant residues may be classified, two major categories are organic contaminant residues and metal ion contaminant residues. Both of these contaminant residues may cause integrated circuit fabrication problems when the residues are allowed to remain upon semiconductor substrates which are subsequently exposed to additional semiconductor processes, in particular, thermal processes. For example, organic contaminant residues are commonly known in the art to result from incomplete removal of photoresists or other organic polymer layers from the surfaces of semiconductor substrates. When allowed to remain upon semiconductor substrate surfaces which are subsequently exposed to thermal processes, organic contaminant residues may carbonize to yield a conductive carbon residue. The conductive carbon residue may be difficult to remove and may compromise the electrical integrity of the semiconductor substrate upon which it is formed.

Although they may provide an analogous set of integrated circuit fabrication problems, metal ion contaminant residues are, in contrast with organic contaminant residues, formed from a separate set of integrated circuit fabrication sources. Metal ion contaminant residues may be formed from several sources within integrated circuit fabrication processes, including but not limited to: (1) partial dissolution and re-deposition of metals from which are formed metal conductor layers, and (2) introduction of metal ions as a consequence of their presence as trace impurities within solvents and photoresist materials through which integrated circuits are processed. The presence of metal ion contaminant residues is particularly troublesome in the early stages of thermal oxidation processing of advanced Metal Oxide Semiconductor Field Effect Transistors (MOSFETs) since the thin gate oxides and shallow diffusion layers which are present in those MOSFETs are particularly susceptible to degradation when impregnated with metal ion contaminant residues.

Methods by which various types of contaminant residues may be removed from semiconductor substrate surfaces prior to or concurrent with the formation of high quality integrated circuit layers upon those surfaces are known in the art. For example, Hile et al., in U.S. Pat. No. 3,837,905 describe the use of Tri-Chloro Ethylene (TCE) as an in-situ source of chlorine forming species, rather than the use of corrosive materials such as chlorine and hydrogen chloride, for gettering alkali metal ion contaminant residues while simultaneously forming high quality silicon oxide coatings upon silicon semiconductor substrates through thermal oxidation methods. In addition, Sherman in U.S. Pat. No. 4,563,367 describes a semiconductor processing apparatus and a method by which that semiconductor processing apparatus may be employed in high speed etching from semiconductor substrates or high speed depositing upon semiconductor substrates high quality dielectric films.

Further, Sugino in U.S. Pat. No. 5,178,721 discloses a stand alone apparatus and photochemical method through which halogen radicals are formed for dry cleaning of metal ion contaminant residues from semiconductor wafer surfaces. Still further, Chien et al., in U.S. Pat. No. 5,328,867 disclose a method for removing water spots from integrated circuit substrates from which native oxide layers have been removed. The disclosed method employs a cleaning solution which contains hydrogen peroxide.

Yet further, Lagendijk et al., in U.S. Pat. No. 5,298,075 disclose a method which may alternatively be employed in thermally oxidizing silicon substrates or cleaning from semiconductor furnace tubes trace quantities of metal ion contaminant residues. The method employs chloro-hydrocarbons which dissociate efficiently at low temperatures. Finally, Iwasaki et al., in U.S. Pat. No. 5,407,867 disclose an integrated photochemically assisted apparatus and method for removing from a semiconductor substrate a native oxide film with its associated contaminants, and sequentially forming upon the bare semiconductor substrate a separate thin film with controlled interfacial characteristics.

Desirable in the art is a method whereby both organic contaminant residues and metal ion contaminant residues may simultaneously be removed from integrated circuit substrate surfaces prior to exposing those substrates to thermal processes. Highly desirable in the art is a method which may be applied independent of the nature of the thermal process to which the semiconductor substrate is subsequently exposed. Most desirable in the art is a method which is readily adaptable to existing thermal process semiconductor manufacturing equipment.

SUMMARY OF THE INVENTION

A first object of the present invention is to provide a method for simultaneously removing from semiconductor substrate surfaces organic contaminant residues and metal ion contaminant residues prior to exposing those semiconductor substrates to thermal processes.

A second object of the present invention is to provide a method in accord with the first object of the present invention, which method may be applied independent of the nature of the thermal process to which the semiconductor substrate wafer is subsequently exposed.

A third object of the present invention is to provide a method in accord with the first object of the present invention and the second object of the present invention, which method is readily adaptable in-situ to existing semiconductor thermal process manufacturing equipment.

In accord with the objects of the present invention, a method for simultaneously removing from semiconductor substrate surfaces organic contaminant residues and metal ion contaminant residues prior to exposing those semiconductor substrates to thermal processes is disclosed. To practice the method of the present invention, there is first introduced into a semiconductor substrate processing chamber a semiconductor substrate. The semiconductor substrate and the semiconductor substrate processing chamber are maintained at a temperature not exceeding about 800 degrees centigrade. Introduced into the semiconductor substrate processing chamber substantially simultaneously with the semiconductor substrate is a low flow of a first oxidant gas. Introduced into the semiconductor substrate processing chamber immediately following the low flow of the first oxidant gas is a high flow of a second oxidant gas. Introduced into the semiconductor substrate processing chamber no earlier than the high flow of the second oxidant gas is a flow of a chlorine containing getter material. The difference in time between introducing the high flow of the second oxidant gas and introducing the flow of the chlorine containing getter material is a time delay. Finally, the semiconductor substrate is exposed to the high flow of the second oxidant gas and the flow of chlorine containing getter material at a temperature not exceeding about 800 degrees centigrade for a time period sufficient to remove organic contaminant residues and metal ion contaminant residues from the surface of the semiconductor substrate.

The method of the present invention simultaneously removes from semiconductor substrate surfaces organic contaminant residues and metal ion contaminant residues prior to exposing those semiconductor substrates to thermal processes. Through the method of the present invention there is introduced into a semiconductor substrate processing chamber a high flow of a second oxidant gas and a flow of a chlorine containing getter material, both of which are maintained at a temperature of no greater than about 800 degrees centigrade. At the temperature at which the present invention is practiced, the high flow of the second oxidant gas is useful in oxidizing organic contaminant residues from the surfaces of semiconductor substrates. Simultaneously, the flow of the chlorine containing getter material is useful in volatilizing from the surfaces of semiconductor substrates or stabilizing upon the surfaces of semiconductor substrates metal ion contaminant residues. In addition, the low flow of the first oxidant gas is useful in preventing carbonization of organic contaminant residues on semiconductor substrates exposed to elevated temperatures. Both the oxidizing of the organic contaminant residues and the volatilizing or stabilizing of metal ion contaminant residues may readily occur prior to thermal processing of a semiconductor substrate.

The method of the present invention may be practiced independent of the nature of the thermal process to which the semiconductor substrate are subsequently exposed after the organic contaminant residue and the metal ion contaminant residue is removed from or stabilized upon the surface of the semiconductor substrate. The method of the present invention places no limitations upon the nature of the semiconductor process which follows the semiconductor substrate cleaning method of the present invention. Although not required, the method of the present invention may be undertaken within the same semiconductor substrate processing chamber within which is undertaken the semiconductor substrate processing which follows the semiconductor substrate cleaning method of the present invention.

The method of the present invention is readily adaptable to existing semiconductor thermal processing manufacturing equipment. The method of the present invention may be practiced in the same semiconductor substrate processing chamber within which is provided a thermal process which follows the semiconductor substrate cleaning method of the present invention. In addition, the semiconductor substrate cleaning method of the present invention typically requires no modification to the semiconductor substrate processing chamber within which the method of the present invention is practiced. The method of the present invention may be practiced in-situ through modification of temperatures and flow rates of oxidant gases and chlorine containing getter materials through which is practiced the method of the present invention.

BRIEF DESCRIPTION OF THE DRAWINGS

The accompanying drawings, which form a material part of this disclosure, show the following.

DESCRIPTION OF THE PREFERRED
EMBODIMENTS

The present invention provides a semiconductor substrate cleaning method through which organic contaminant residues and metal ion contaminant residues may be removed from semiconductor substrate surfaces prior to exposing those semiconductor substrates to thermal processes. The method of the present invention provides a comparatively low temperature process whereby an organic contaminant residue is removed from the surface of a semiconductor substrate through sequential exposure to a low flow of a first oxidant gas immediately followed by a high flow of a second oxidant gas, and a metal ion contaminant residue is simultaneously removed from or stabilized upon the surface of the same semiconductor substrate through exposure to a flow of a chlorine containing getter material.

Although the method of the present invention is most likely to be employed as an in-situ preclean prior to thermal processing of a semiconductor substrate, the method of the present invention has broader applicability within semiconductor substrate processing. The method of the present invention may be practiced upon any semiconductor substrate where it is desired to simultaneously: (1) remove from the semiconductor substrate surface organic contaminant residues, and (2) either remove from or stabilize upon the semiconductor substrate surface metal ion contaminant residues. Thus, the method of the present invention may be employed upon semiconductor substrates upon which there may previously or subsequently be practiced integrated circuit processes including but not limited to thermal processes, photolithographic processes and etching processes.

Complementing the broad range of semiconductor substrate processes prior to or subsequent to which the semiconductor substrate cleaning method of the present invention may be practiced is the broad range of integrated circuits within which the semiconductor substrate cleaning method of the present invention may be employed. The method of the present invention may be employed in cleaning semiconductor substrates employed in forming integrated circuits including but not limited to Dynamic Random Access Memory (DRAM) integrated circuits, Static Random Access Memory (SRAM) integrated circuits, Application Specific Integrated Circuits (ASICs), integrated circuits containing within their structures field effect transistors, integrated circuits containing within their structures bipolar transistors and integrated circuits containing within their structures Bipolar Complementary Metal Oxide Semiconductor (BiCMOS) transistors. The semiconductor substrate cleaning method of the present invention has broad applicability encompassing both the process sequence and the integrated circuit type within which it may be practiced.

Figure 1:
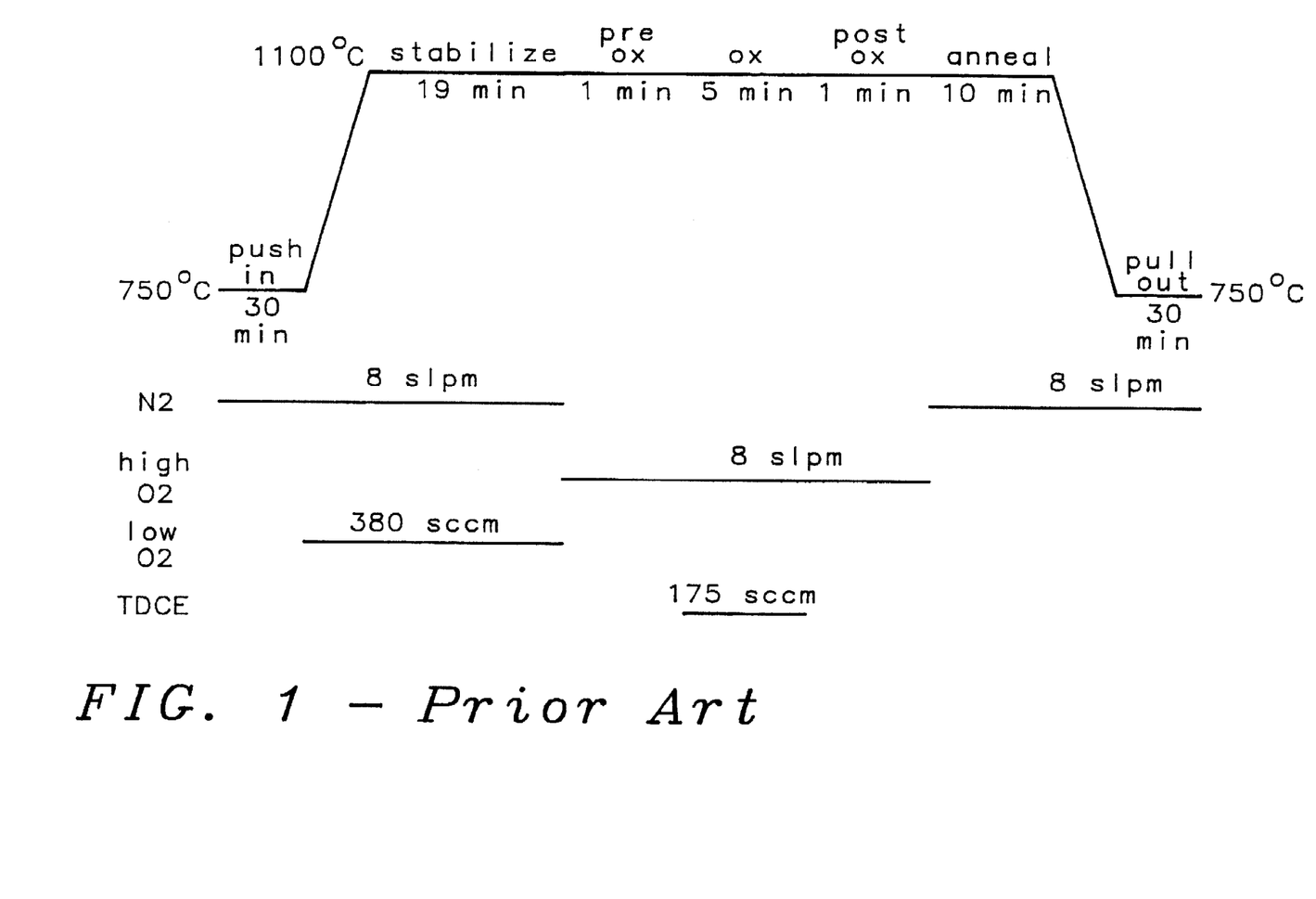
FIG. 1 shows a process flow schematic diagram illustrating process times, process temperatures, gas compositions and gas flow rates for a silicon semiconductor substrate initial oxidation process conventional to the art.
Figure 2:
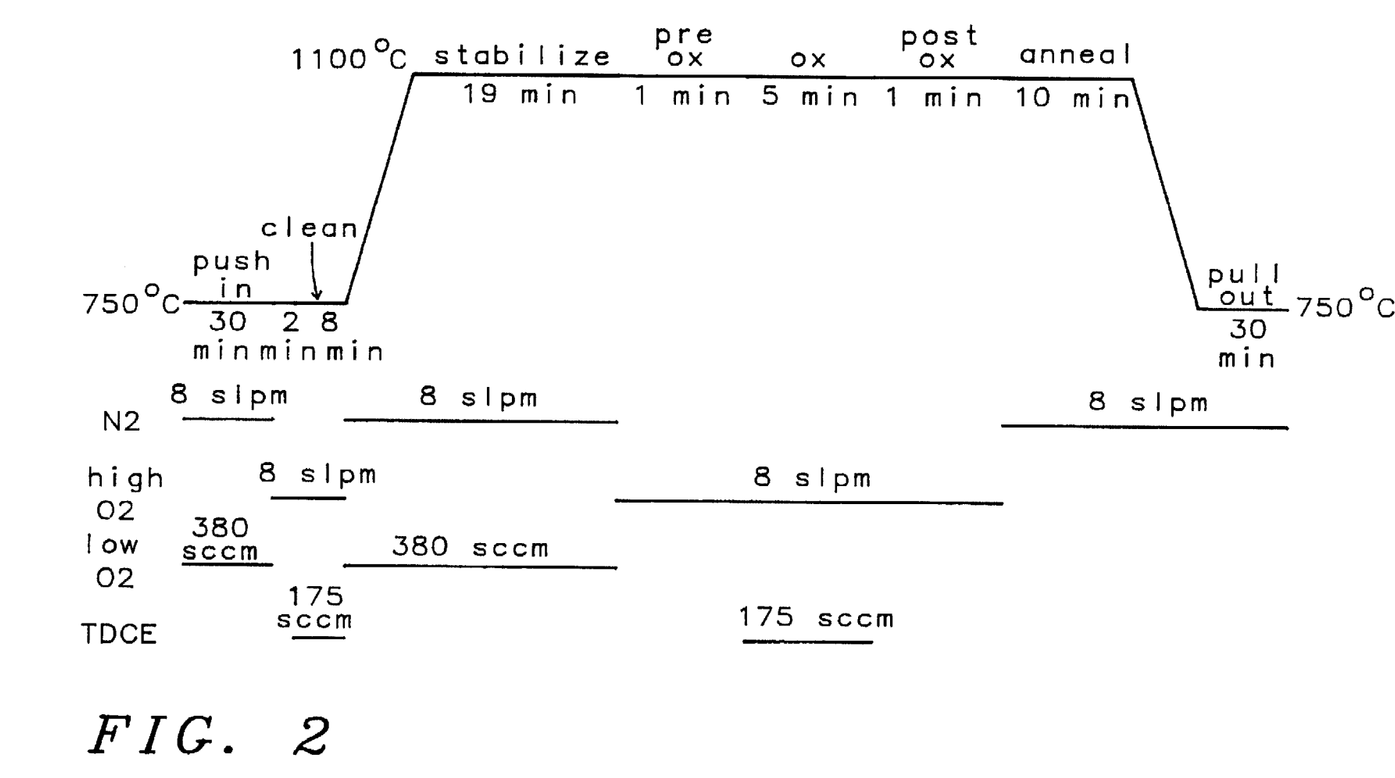
FIG. 2 shows a process flow schematic diagram illustrating process times, process temperatures, gas compositions and gas flow rates for a silicon semiconductor substrate initial oxidation process incorporating the semiconductor substrate cleaning method of the present invention.

The semiconductor substrate cleaning method of the present invention will now be disclosed by reference to FIG. 1 and FIG. 2.

Referring now to FIG. 1 there is shown a schematic process flow diagram illustrating process times, process temperatures, gas compositions and gas flow rates for a silicon semiconductor substrate initial oxidation process conventional to the art of integrated circuit manufacture. Shown within the upper portion of FIG. 1 is a process time line and a process temperature line. Shown within the lower portion of FIG. 1 are the gas compositions and the gas flow rates that correspond to the process time line and process temperature line.

As shown in FIG. 1, the conventional silicon semiconductor substrate initial oxidation process begins at a temperature of about 750 degrees centigrade for an initial time of about 30 minutes with a flow of nitrogen gas at about 8 standard liters per minute (slpm). The temperature is then raised to about 1100 degrees centigrade at a rate of about 5 degrees per minute and stabilized at 1100 degrees centigrade for a process time of about 19 minutes. During the temperature rise and subsequent stabilization, a low flow of oxygen gas at about 380 standard cubic centimeters per minute (sccm) is added to the nitrogen gas flow at about 8 standard liters per minute (slpm). After the 19 minute stabilization period at about 1100 degrees centigrade, the nitrogen gas flow and the low flow of oxygen gas are terminated and a high flow of oxygen gas at about 8 standard liters per minute (slpm) is begun. After 1 minute of pre-oxidation process time at about 1100 degrees centigrade and a high flow of oxygen gas at about 8 standard liters per minute (slpm), a flow of Trans-Di-Chloro-Ethylene (TDCE) chlorine containing getter material is simultaneously introduced into the semiconductor substrate process reactor at a flow rate of about 175 standard cubic centimeters per minute (sccm) for a time period of about 5 minutes. After the 5 minute period, the flow of Trans-Di-Chloro-Ethylene (TDCE) chlorine containing getter material is terminated and the high flow of oxygen gas at 8 standard liters per minute (slpm) is continued for a post oxidation process time of about 1 minute, at which time the high flow of oxygen gas is also terminated. The semiconductor substrate is then annealed at a temperature of about 1100 degrees centigrade and subsequently cooled to a final temperature of about 750 degrees centigrade. The change in temperature to the final temperature of about 750 degrees centigrade is undertaken at a rate of about 3 degrees per minute. The semiconductor substrate then remains at the final temperature of about 750 degrees centigrade for a process time of about 30 minutes. During the annealing, the cooling and the process time at the final temperature, a flow of nitrogen gas at about 8 standard liters per minute (slpm) is provided to the semiconductor substrate processing chamber.

Referring now to FIG. 2, there is illustrated a schematic process flow diagram which corresponds to the schematic process flow diagram of FIG. 1 with the exception that the semiconductor substrate cleaning method of the present invention has been incorporated into the schematic process flow diagram of FIG. 2. The schematic process flow diagram of FIG. 2 represents the first preferred embodiment of the present invention. Shown in FIG. 2 are two additional process steps which follow the initial stabilization of the semiconductor substrate for 30 minutes at 750 degrees centigrade and precede the change in temperature from 750 degrees centigrade to 1100 degrees centigrade. Also shown in FIG. 2 is one additional process step which occurs simultaneously with the initial stabilization of the semiconductor substrate for 30 minutes at 750 degrees centigrade. Together, these three additional process steps comprise the semiconductor substrate cleaning method of the first preferred embodiment of the present invention. As illustrated in FIG. 2, each of these three process steps occurs at a temperature of about 750 degrees centigrade. Although not illustrated in FIG. 2, these three additional process steps preferably occur at a semiconductor substrate processing chamber pressure of about 700 to about 780 torr.

It is not critical that the semiconductor substrate cleaning method of the present invention be practiced only at a temperature of about 750 degrees centigrade. It is, however, preferred that the semiconductor substrate cleaning method of the present invention be practiced at a temperature no higher than about 800 degrees centigrade. It is most preferred that the semiconductor substrate cleaning method of the present invention be practiced at a temperature of about 600 to about 800 degrees centigrade. The lower temperatures at which the semiconductor substrate cleaning method of the present invention is practiced (in comparison with the thermal processes which will typically follow the semiconductor substrate cleaning method of the present invention) are desirable since the lower temperatures provide for limited oxide growth upon the semiconductor substrates upon which is performed the semiconductor substrate wafer cleaning method of the present invention.

It is also not required that the semiconductor substrate cleaning method of the present invention be practiced in the same semiconductor substrate processing chamber as is employed in subsequently processing the semiconductor substrate upon which is practiced the semiconductor substrate cleaning method of the present invention. It is, however, preferred that the semiconductor substrate cleaning method of the present invention be practiced in-situ in the same semiconductor substrate processing chamber as is subsequently processed the semiconductor substrate upon which is practiced the semiconductor substrate cleaning method of the present invention. Most preferably, the semiconductor substrate cleaning method of the present invention is practiced in-situ as a semiconductor substrate cleaning method prior to a thermal process practiced upon a semiconductor substrate. The semiconductor substrate cleaning method and the thermal process are preferably undertaken in a semiconductor wafer furnace tube which represents the semiconductor substrate processing chamber. Preferred thermal processes prior to which may be practiced in-situ the semiconductor substrate cleaning method of the present invention are thermal oxidation processes and thermal annealing processes.

The first process step in practicing the semiconductor substrate cleaning method of the present invention is to provide a low flow of a first oxidant gas into a semiconductor substrate processing chamber substantially simultaneously with the introduction of a semiconductor substrate into the semiconductor substrate processing chamber. Although alternative oxidant gases may exist, oxygen is preferred as the first oxidant gas, for commercial reasons. The low flow of the first oxidant gas is preferably introduced into the semiconductor substrate processing chamber at a flow of about 100 to about 1000 standard cubic centimeters per minute (sccm).

As illustrated in FIG. 2, the low flow of the first oxidant gas for the first preferred embodiment of the present invention is provided by a low flow of oxygen at about 380 standard cubic centimeters per minute (sccm) for a period of about 30 minutes.

The second process step in practicing the semiconductor substrate cleaning method of the present invention is the introduction of a high flow of a second oxidant gas into the same semiconductor substrate processing chamber immediately subsequent to the low flow of the first oxidant gas. Analogously with the low flow of the first oxidant gas, there may exist alternative oxidant gases which may be employed as the second oxidant gas. However, for commercial reasons, oxygen is preferably employed as the second oxidant gas. The high flow of the second oxidant gas is preferably provided by a high flow of oxygen at about 5 to about 15 standard liters per minute (slpm).

As illustrated in FIG. 2, the high flow of the second oxidant gas for the first preferred embodiment of the present invention is provided by a high flow of oxygen gas at about 8 standard liters per minute (slpm) immediately subsequent to the low flow of oxygen at 380 standard cubic centimeters per minute (sccm), which low flow of oxygen represents the low flow of the first oxidant gas.

The third process step in practicing the semiconductor substrate cleaning method of the present invention is the introduction of a flow of a chlorine containing getter material into the semiconductor substrate processing chamber for a time at least partially coincident with the high flow of the second oxidant gas. The purpose of the chlorine containing getter material is to either volatilize from the surface of the semiconductor substrate or stabilize upon the surface of the semiconductor substrate metal ion contaminant residues. There are several chlorine containing getter materials known in the art which can serve this purpose, including but not limited to Tri-Chloro-Ethane (TCA), Tri-Chloro-Ethylene (TCE), Hydrogen Chloride (HCl), Trans-Di-Chloro-Ethylene (TDCE) and Cis-Di-Chloro-Ethylene (CDCE). Any of the preceding chlorine containing getter materials may preferably be employed as the chlorine containing getter material in practice of the present invention. Most preferably, Trans-Di-Chloro-Ethylene (TDCE) is employed as the chlorine containing getter material in practice of the semiconductor substrate cleaning method of the present invention, due largely to its efficient formation of chlorine containing getter species at low temperatures. Preferably, the chlorine containing getter material is introduced into the semiconductor processing chamber at a flow rate of about 50 to about 250 standard cubic centimeters per minute (sccm).

As illustrated by FIG. 2, the chlorine containing getter material for the first preferred embodiment of the present invention is Trans-Di-Chloro-Ethylene (TDCE). For the first preferred embodiment of the present invention, the flow of the chlorine containing getter material Trans-Di-Chloro-Ethylene (TDCE) is introduced into the semiconductor substrate reactor chamber at a flow of about 175 standard cubic centimeters per minute (sccm).

Finally, the last important parameter in practice of the semiconductor substrate cleaning method of the present invention is the point in time within the semiconductor substrate cleaning method at which the high flow of the second oxidant gas and the flow of the chlorine containing getter material are introduced into the semiconductor substrate processing chamber. For the present invention, it is preferred that the flow of the chlorine containing getter material is introduced into the semiconductor substrate processing chamber no later than a time delay of about two minutes after the high flow of the second oxidant gas is introduced into the semiconductor substrate processing chamber. After introducing the high flow of the chlorine containing getter material into the semiconductor substrate processing chamber, the semiconductor substrate upon which is practiced the method of the present invention is preferably exposed to the high flow of the second oxidizing gas and the flow of the chlorine containing getter material for a time sufficient to: (1) completely remove from the semiconductor substrate any organic contaminant residue, and (2) completely volatilize from the semiconductor substrate or stabilize upon the semiconductor substrate any metal ion contaminant residue.

As illustrated in FIG. 2, the time delay for introducing the Trans-Di-Chloro-Ethylene (TDCE) chlorine containing getter material after introduction of the high flow of the second oxidant gas oxygen is about 2 minutes for the first preferred embodiment of the present invention.

Upon completing the semiconductor substrate cleaning method of the first preferred embodiment of the present invention, there is formed a semiconductor substrate which may subsequently be subjected in-situ to a semiconductor substrate initial oxide thermal oxidation process with less probability of forming defects attributable to organic contaminant residues and metal ion contaminant residues.

In addition to the first preferred embodiment of the present invention, there also exist two additional preferred embodiments of the present invention. The first additional preferred embodiment incorporates the semiconductor substrate cleaning method of the present invention as an in-situ pre-clean prior to a pad oxide thermal oxidation process. This embodiment comprises the second preferred embodiment of the present invention. The second preferred embodiment of the present invention is shown by reference to FIG. 3 and FIG. 4.

Figure 3:
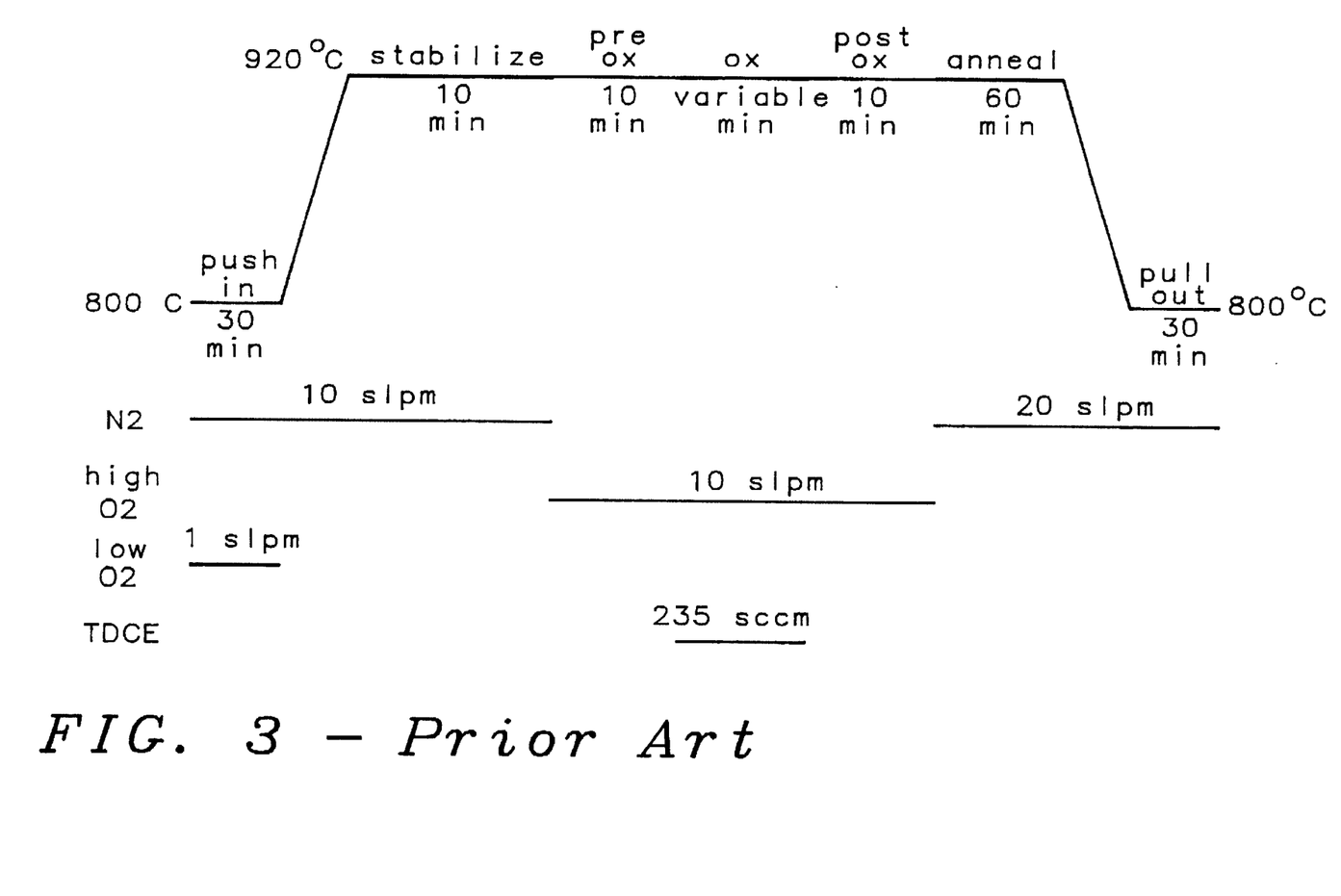
FIG. 3 shows a process flow schematic diagram illustrating process times, process temperatures, gas compositions and gas flow rates for a silicon semiconductor substrate pad oxide oxidation process conventional to the art.
Figure 4:
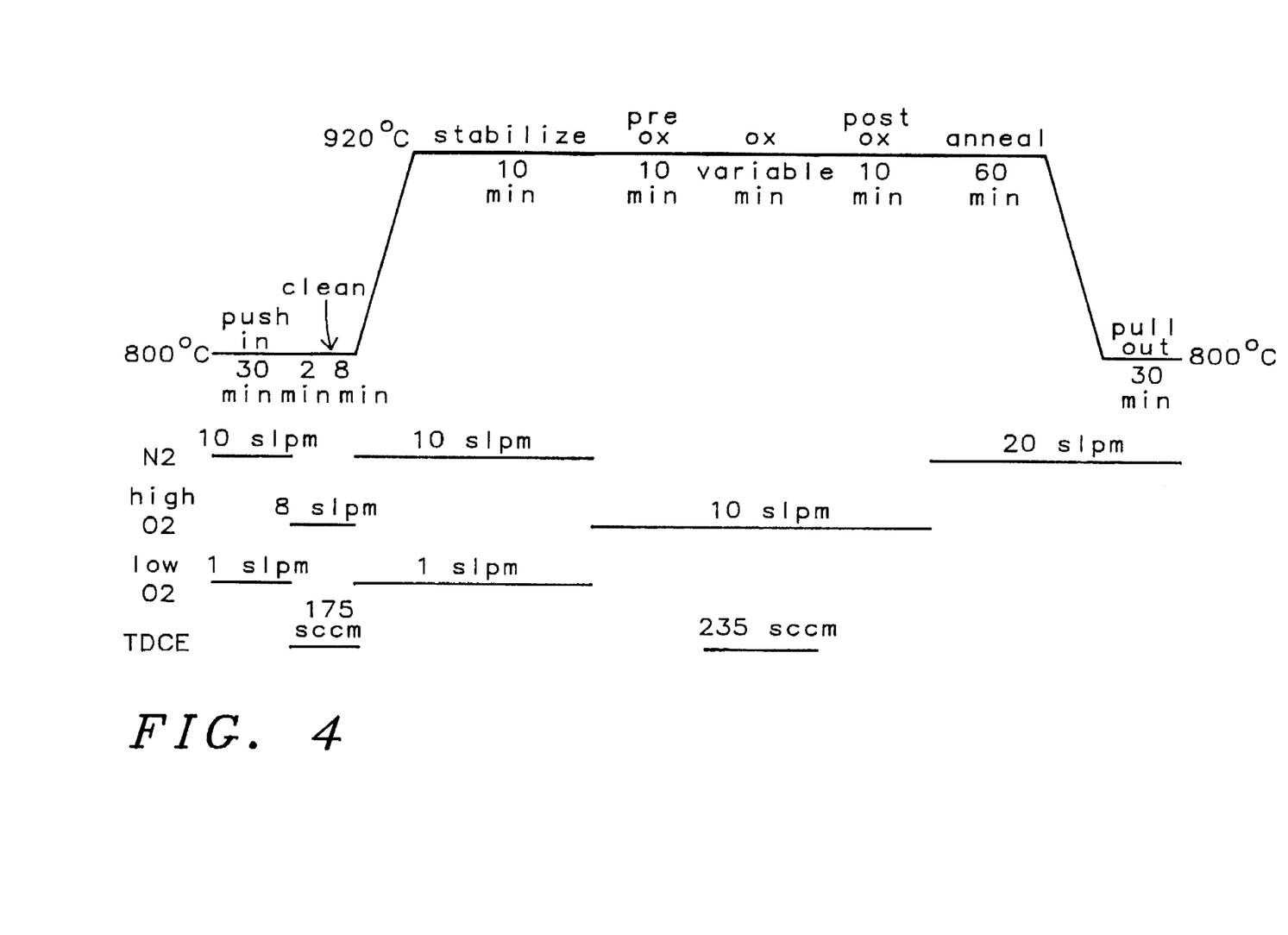
FIG. 4 shows a process flow schematic diagram illustrating process times, process temperatures, gas compositions and gas flow rates for a silicon semiconductor substrate pad oxide oxidation process incorporating the semiconductor substrate cleaning method of the present invention.

Shown in FIG. 3 and FIG. 4 are a pair of schematic process flow diagrams illustrating process times, process temperatures, gas compositions and gas flow rates for the silicon semiconductor substrate pad oxide thermal oxidation process. The conventional process is illustrated in FIG. 3 and the process into which has been incorporated the semiconductor substrate cleaning method of the present invention is shown in FIG. 4.

Analogously to the first preferred embodiment of the present invention, the semiconductor substrate wafer cleaning method, as incorporated to form the second preferred embodiment of the present invention, is incorporated into a semiconductor substrate pad oxide thermal oxidation process coincident and subsequent to stabilizing a semiconductor substrate at a lower temperature and prior to oxidizing the semiconductor substrate at a higher temperature. Analogously to the first preferred embodiment of the present invention, the semiconductor substrate cleaning method of the second preferred embodiment of the present invention is also undertaken at a semiconductor substrate processing chamber pressure of about 700 to about 780 torr.

By reference to FIG. 3 and FIG. 4, in comparison with FIG. 1 and FIG. 2, it is seen that various of the process temperatures, process times and gas flow rates of the semiconductor substrate pad oxide thermal oxidation process may be adjusted in comparison with the semiconductor substrate initial oxide thermal oxidation process while still providing an embodiment into which may be incorporated the semiconductor substrate cleaning method of the present invention. In particular, it is seen in FIG. 3 that the conventional semiconductor substrate pad oxide thermal oxidation process typically incorporates a low flow of oxygen at about 1 standard liter per minute (slpm) simultaneous with a nitrogen flow at about 10 standard liters per minute (slpm) while initially stabilizing a semiconductor substrate at about 800 degrees centigrade. Thus, within the second preferred embodiment of the present invention, the low flow of the first oxidant gas is provided by the low flow of oxygen at about 1 standard liter per minute (slpm) oxygen prior to the high flow of the second oxidant gas which is provided by a high flow of oxygen gas at about 8 standard liters per minute, as illustrated in FIG. 4. There is also illustrated in FIG. 4 the presence of the flow of chlorine containing getter material Trans-Di-Chloro-Ethylene (TDCE) at about 175 standard cubic centimeters per minute. Within the second preferred embodiment as illustrated in FIG. 4, there exists no time delay between introduction of the high flow of the second oxidant gas oxygen and the flow of the chlorine containing getter material.

Finally, the second additional preferred embodiment of the present invention is an embodiment wherein the semiconductor substrate cleaning method of the present invention is incorporated as an in-situ pre-clean prior to a semiconductor substrate annealing process. This embodiment represents the third preferred embodiment of the present invention. The third preferred embodiment of the present invention is illustrated by reference to FIG. 5 and FIG. 6.

Figure 5:
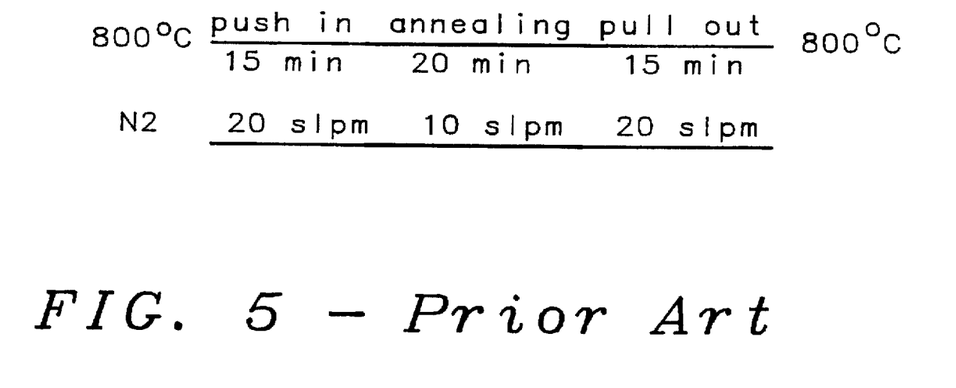
FIG. 5 shows a process flow schematic diagram illustrating process times, process temperatures, gas compositions and gas flow rates for a semiconductor substrate annealing process conventional to the art.
Figure 6:
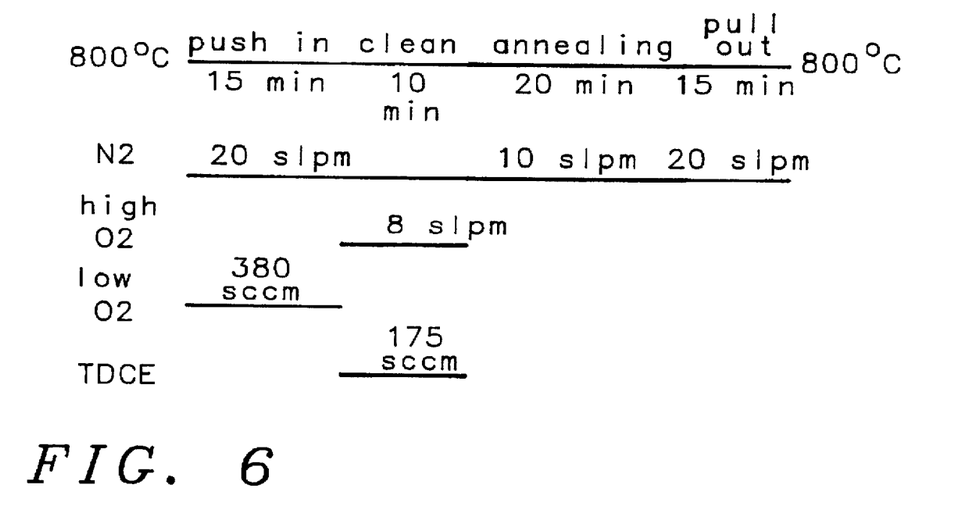
FIG. 6 shows a process flow schematic diagram illustrating process times, process temperatures, gas compositions and gas flow rates for a semiconductor substrate annealing process incorporating the semiconductor substrate cleaning method of the present invention.

Shown in FIG. 5 and FIG. 6 is a pair of schematic process flow diagrams illustrating the process times, process temperatures, gas compositions and gas flow rates for the semiconductor substrate annealing process into which is incorporated the semiconductor substrate cleaning method of the present invention. FIG. 5 illustrates the conventional process and FIG. 6 illustrates the conventional process into which has been incorporated the semiconductor substrate cleaning method of the present invention.

As shown by FIG. 6, the semiconductor substrate cleaning method of the present invention, as incorporated into the semiconductor substrate annealing process, starts with a low flow of a first oxidant gas oxygen at about 380 standard cubic centimeters per minute (sccm) introduced substantially simultaneously with semiconductor substrates which are introduced into the semiconductor substrate processing chamber. After the low flow of the first oxidant gas oxygen, there is introduced a high flow of a second oxidant gas oxygen at a flow of about 8 standard liters per minute (slpm). Simultaneously with the high flow of the second oxidant gas oxygen, and without a time delay, there is introduced a flow of chlorine containing getter material Trans-Di-Chloro-Ethylene (TDCE) at about 175 standard cubic centimeters per minute (sccm).

As also shown by FIG. 6, the thermal process which follows the semiconductor substrate cleaning process of the present invention need not necessarily be undertaken at a higher temperature than the semiconductor substrate cleaning process of the present invention. The thermal process which follows the semiconductor substrate cleaning process of the present invention may be undertaken at an equivalent or a lower temperature than the semiconductor substrate cleaning method of the present invention. Analogously to the first preferred embodiment of the present invention and the second preferred embodiment of the present invention, the third preferred embodiment of the present invention is also undertaken at a semiconductor substrate processing chamber pressure of about 700 to about 780 torr.

Upon completing the semiconductor wafer cleaning processes in accord with the second preferred embodiment and the third preferred embodiment of the present invention, there is formed a semiconductor substrate which may be exposed to a pad oxide thermal oxidation process or a thermal annealing process, respectively, with limited susceptibility to forming defects attributable to organic contaminant residues and metal ion contaminant residues.

EXAMPLES 1–6

In order to evaluate the efficacy of the semiconductor substrate cleaning method of the present invention, in comparison with conventional semiconductor substrate cleaning methods, six (100) semiconductor substrate wafers were obtained and the native oxide was stripped from the six semiconductor substrate wafers through immersion in 50:1 dilute hydrofluoric acid solution. Upon each of the bare semiconductor substrate wafer surfaces was then coated a layer of TOK-3100 brand photoresist manufactured by the Tokyoka Company. The photoresist layers were then stripped from the six semiconductor substrate wafer surfaces through immersion in a Caros acid mixture comprising 5 parts by volume 98% sulfuric acid and 1 part by volume 30% hydrogen peroxide, followed by deionized water rinsing and spin drying as is conventional in the art. Stripping of the TOK-3100 brand photoresist through immersion in Caros acid mixture is known in the art to leave remaining upon semiconductor substrate surfaces both organic contaminant residues and metal ion contaminant residues.

The six wafers were then divided into three individual groups of two wafers each, and the three individual groups were each individually exposed to three separate cleaning processes. The first group received a pre gate oxide cleaning process conventional to the art. The process comprised immersion of the wafers sequentially through four different cleaning solutions. The first solution was comprised of 5 volume parts concentrated sulfuric acid and 1 volume part concentrated hydrogen peroxide. The second solution was a 100:1 dilute hydrofluoric acid solution. The third solution was comprised of 1 volume part concentrated hydrochloric acid, 1 volume part concentrated hydrogen peroxide and 5 volume parts deionized water. Finally, the fourth solution was comprised of 1 volume part concentrated ammonium hydroxide, 1 volume part concentrated hydrogen peroxide and 5 volume parts deionized water.

The second group received the same pre gate oxide cleaning process employed for the first group, but the pre gate oxide cleaning process was also followed by the in-situ pre-initial oxide semiconductor substrate cleaning process of the first preferred embodiment of the present invention. The third group received only the in-situ pre-initial oxide semiconductor substrate cleaning process of the first preferred embodiment of the present invention. The three groups of two wafers each were then reunited for further processing.

Each of the six wafers then had grown upon its surface a gate oxide of about 175 angstroms thickness through a thermal oxidation process at about 920 degrees centigrade. Formed then upon the individual gate oxide layers were doped patterned polysilicon layers which in conjunction with the six semiconductor substrate wafers formed a series of 166 capacitors upon the surface of each of the six semiconductor substrate wafers. Electrical integrity of each of the six series of 166 capacitors was determined through determining the capacitor failure rate as a function of electric field strength (ie: applied voltage). Two failure categories were defined. The first was low electric field strength capacitor failures at a voltage of less than about 5 volts. The second failure category was a higher voltage capacitor failure in the range of about 5 to about 12 volts. Failures in the low voltage range are generally attributable to substantive defects such as pinholes or conductive particles within the gate oxide. Failures within the higher voltage range are generally attributable to carbonized organic contaminant residues or metal ion contaminant residues within the gate oxide. The results of the electrical testing are reported in TABLE I.

TABLE I

| Example | Substrate Clean | 0–5 Volt Fails | 5–12 Volt Fails |
| --- | --- | --- | --- |
| 1 | Conventional | 3/166 | 18/166 |
| 2 | Conventional | 2/166 | 0/166 |
| 3 | Conv. + Invention | 3/166 | 7/166 |
| 4 | Conv. + Invention | 1/166 | 6/166 |
| 5 | Invention | 3/166 | 4/166 |
| 6 | Invention | 1/166 | 2/166 |

From review of the data of TABLE I it is seen that a significant average reduction in the level of higher voltage failures is observed for capacitors which are formed upon semiconductor substrate wafers whose surfaces have been previously cleaned through the in-situ semiconductor substrate cleaning method of the present invention. This significant average reduction is obtained with no apparent impact upon the low voltage capacitor failure rate. From the data of TABLE I it is also seen that the semiconductor substrate cleaning method of the present invention provides a superior substrate from which may be formed gate oxides than either conventional semiconductor substrate cleaning methods or conventional semiconductor substrate cleaning methods followed by the semiconductor substrate cleaning method of the present invention.

As is understood by a person skilled in the art, revisions may be made to the methods and materials through which are provided the preferred embodiments and the EXAMPLES of the present invention while still providing embodiments and EXAMPLES which are within the spirit and scope of the present invention.

What is claimed is:

1. A method for cleaning a semiconductor substrate consisting of:

introducing a semiconductor substrate into a semiconductor substrate processing chamber, the semiconductor substrate and the semiconductor substrate processing chamber being maintained at a temperature not exceeding about 800 degrees centigrade;

introducing into the semiconductor substrate processing chamber substantially simultaneously with the semiconductor substrate a low flow of a first oxidant gas, the first oxidant gas being oxygen gas, the low flow of the first oxidant gas being immediately followed by a high flow of a second oxidant gas;

introducing into the semiconductor substrate processing chamber no earlier than the high flow of the second oxidant gas a flow of a chlorine containing getter material, the difference in time between introducing the high flow of the second oxidant gas and introducing the flow of the chlorine containing getter material being a time delay; and exposing the semiconductor substrate to the high flow of the second oxidant gas and the flow of the chlorine containing getter material at the temperature not exceeding about 800 degrees centigrade for a time period sufficient to remove from the semiconductor substrate organic contaminant residues and remove from or stabilize upon the semiconductor substrate metallic species which are detrimental to integrated circuit devices subsequently formed upon the semiconductor substrate, where the organic contaminant residues are removed from the semiconductor substrate and the metallic species are removed from or stabilized upon the semiconductor substrate without carbonizing the organic contaminant residues.

2. The method of claim 1 wherein the semiconductor substrate processing chamber is maintained at a pressure of about 700 to about 780 torr.

3. The method of claim 1 wherein the temperature of the semiconductor substrate and the semiconductor substrate processing chamber is from about 600 to about 800 degrees centigrade.

4. The method of claim 1 wherein the low flow of the first oxidant gas is a low flow of oxygen at about 100 to about 1000 standard cubic centimeters per minute (sccm).

5. The method of claim 1 wherein the high flow of the second oxidant gas is a high flow of oxygen at about 5 to about 15 standard liters per minute (slpm).

6. The method of claim 1 wherein the flow of chlorine containing getter material is from about 50 to about 250 standard cubic centimeters per minute (sccm).

7. The method of claim 1 wherein the chlorine containing getter material is chosen from the group of chlorine containing getter materials consisting of Tri-Chloro-Ethane (TCA), Tri-Chloro-Ethylene (TCE), Hydrogen Chloride (HCl), Trans-Di-Chloro-Ethylene (TDCE) and Cis-Di-Chloro-Ethylene (CDCE).

8. The method of claim 1 wherein the time delay is no greater than about 2 minutes.

9. A method for cleaning a semiconductor substrate prior to a thermal process consisting of:

introducing a semiconductor substrate into a semiconductor substrate processing chamber, the semiconductor substrate and the semiconductor substrate processing chamber being maintained at a temperature not exceeding about 800 degrees centigrade;

introducing into the semiconductor substrate processing chamber substantially simultaneously with the semiconductor substrate a low flow of a first oxidant gas, the first oxidant gas being oxygen gas, the low flow of the first oxidant gas being immediately followed by a high flow of a second oxidant gas;

introducing into the semiconductor substrate processing chamber no earlier than the high flow of the second oxidant gas a flow of a chlorine containing getter material, the difference in time between introducing the high flow of the second oxidant gas and introducing the flow of the chlorine containing getter material being a time delay;

exposing the semiconductor substrate to the high flow of the second oxidant gas and the flow of the chlorine containing getter material at the temperature not exceeding about 800 degrees centigrade for a time period sufficient to remove from the semiconductor substrate organic contaminant residues and remove from or stabilize upon the semiconductor substrate metallic species which are detrimental to integrated circuit devices subsequently formed upon the semiconductor substrate, where the organic contaminant residues are removed from the semiconductor substrate and the metallic species are removed from or stabilized upon the semiconductor substrate without carbonizing the organic contaminant residues; and exposing then the semiconductor substrate to a thermal process.

10. The method of claim 9 wherein the semiconductor substrate processing chamber is a semiconductor wafer furnace tube maintained at a pressure of from about 700 to about 780 torr.

11. The method of claim 10 wherein the temperature of the semiconductor substrate and the semiconductor wafer furnace tube is from about 600 to about 800 degrees centigrade.

12. The method of claim 9 wherein the low flow of the first oxidant gas is a low flow of oxygen at about 100 to about 1000 standard cubic centimeters per minute (sccm).

13. The method of claim 9 wherein the high flow of the second oxidant gas is a high flow of oxygen at about 5 to about 15 standard liters per minute (slpm).

14. The method of claim 9 wherein the flow of chlorine containing getter material is from about 50 to about 250 standard cubic centimeters per minute (sccm).

15. The method of claim 9 wherein the chlorine containing getter material is chosen from the group of chlorine containing getter materials consisting of Tri-Chloro-Ethane (TCA), Tri-Chloro-Ethylene (TCE), Hydrogen Chloride (HCl), Trans-Di-Chloro-Ethylene (TDCE) and Cis-Di-Chloro-Ethylene (CDCE).

16. The method of claim 9 wherein the time delay is no greater than about 2 minutes.

17. A method for cleaning in-situ and subsequently thermally processing a semiconductor substrate consisting of:

introducing a semiconductor substrate into a semiconductor substrate processing chamber, the semiconductor substrate and the semiconductor substrate processing chamber being maintained at a temperature not exceeding about 800 degrees centigrade;

introducing into the semiconductor substrate processing chamber substantially simultaneously with the semiconductor substrate a low flow of a first oxidant gas, the first oxidant gas being oxygen gas, the low flow of the first oxidant gas being immediately followed by a high flow of a second oxidant gas;

introducing into the semiconductor substrate processing chamber no earlier than the high flow of the second oxidant gas a flow of a chlorine containing getter material, the difference in time between introducing the high flow of the second oxidant gas and introducing the flow of the chlorine containing getter material being a time delay;

exposing the semiconductor substrate to the high flow of the second oxidant gas and the flow of the chlorine containing getter material at the temperature not exceeding about 800 degrees centigrade for a time period sufficient to remove from the semiconductor substrate organic contaminant residues and remove from or stabilize upon the semiconductor substrate metallic species which are detrimental to integrated circuit devices subsequently formed upon the semiconductor substrate, where the organic contaminant residues are removed from the semiconductor substrate and the metallic species are removed from or stabilized upon the semiconductor substrate without carbonizing the organic contaminant residues; and exposing then in-situ the semiconductor substrate to a thermal process.

18. The method of claim 17 wherein the semiconductor substrate process chamber is a semiconductor wafer furnace tube maintained at a pressure of from about 700 to about 780 torr.

19. The method of claim 18 wherein the temperature of the semiconductor substrate and the semiconductor wafer furnace tube is from about 600 to about 800 degrees centigrade.

20. The method of claim 17 wherein the low flow of the first oxidant gas is a low flow of oxygen at about 100 to about 1000 standard cubic centimeters per minute (sccm) and the high flow of the second oxidant gas is a high flow of oxygen at about 5 to about 15 standard liters per minute (slpm).

21. The method of claim 17 wherein the flow of chlorine containing getter material is from about 50 to about 250 standard cubic centimeters per minute (sccm) and the chlorine containing getter material is chosen from the group of chlorine containing getter materials consisting of Tri-Chloro-Ethane (TCA), Tri-Chloro-Ethylene (TCE), Hydrogen Chloride (HCl), Trans-Di-Chloro-Ethylene (TDCE) and Cis-Di-Chloro-Ethylene (CDCE).

22. The method of claim 17 wherein the time delay is no greater than about 2 minutes.

23. The method of claim 17 wherein the thermal process is chosen from the group of thermal processes consisting of thermal oxide growth processes and thermal annealing processes.

24. The method of claim 23 wherein the thermal process is undertaken at a higher temperature than the temperature employed in cleaning the semiconductor substrate wafer.

* * * * *